United States Patent
Ito et al.

(10) Patent No.: US 10,448,498 B2
(45) Date of Patent: Oct. 15, 2019

(54) IN-VEHICLE CONTROLLER

(71) Applicant: Hitachi Automotive Systems, Ltd., Hitachinaka-shi, Ibaraki (JP)

(72) Inventors: Maki Ito, Tokyo (JP); Yuusuke Yasuda, Tokyo (JP); Toshiaki Ishii, Tokyo (JP); Yoshio Kawai, Hitachinaka (JP); Masahiko Asano, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 235 days.

(21) Appl. No.: 15/514,914

(22) PCT Filed: Aug. 21, 2015

(86) PCT No.: PCT/JP2015/073450
§ 371 (c)(1),
(2) Date: Mar. 28, 2017

(87) PCT Pub. No.: WO2016/051991
PCT Pub. Date: Apr. 7, 2016

(65) Prior Publication Data
US 2017/0215271 A1    Jul. 27, 2017

(30) Foreign Application Priority Data
Sep. 29, 2014  (JP) .................... 2014-197750

(51) Int. Cl.
*H05K 1/02*    (2006.01)
*H05K 7/20*    (2006.01)
(Continued)

(52) U.S. Cl.
CPC .......... *H05K 1/0206* (2013.01); *B60R 16/02* (2013.01); *C09D 5/00* (2013.01); *C09D 7/40* (2018.01);
(Continued)

(58) Field of Classification Search
CPC ............ H05K 1/0206; H05K 7/20481; H05K 5/0073; H05K 5/0069; H05K 5/0047;
(Continued)

(56) References Cited

U.S. PATENT DOCUMENTS

2003/0117776 A1    6/2003    Katsuro et al.
2012/0320531 A1    12/2012   Hashimoto et al.
(Continued)

FOREIGN PATENT DOCUMENTS

JP    2004-304200 A    10/2004
JP    2006-281514 A    10/2006
(Continued)

OTHER PUBLICATIONS

International Search Report (PCT/ISA/210) issued in PCT Application No. PCT/JP2015/073450 dated Nov. 2, 2015 with English translation (Three (3) pages).
(Continued)

*Primary Examiner* — Nathan L Van Sell
(74) *Attorney, Agent, or Firm* — Crowell & Moring LLP (57) ABSTRACT

The invention provides an in-vehicle controller equipped with a heat radiation coating film which can efficiently radiate heat from a high temperature portion such as a heat generating body to a casing. An in-vehicle controller includes a heat radiation coating film, wherein the heat radiation coating film includes a first region that has a first boundary surface abutting on a base material, and a second region that has a second boundary surface where the heat radiation coating film abuts on air, wherein a thermal conductivity of the first region is higher than that of the second region, and wherein a thermal emissivity of the second region is higher than that of the first region.

6 Claims, 4 Drawing Sheets

(51) Int. Cl.
  *H05K 5/00* (2006.01)
  *H05K 3/28* (2006.01)
  *C09D 7/40* (2018.01)
  *C09D 5/00* (2006.01)
  *C09D 201/00* (2006.01)
  *B60R 16/02* (2006.01)

(52) U.S. Cl.
  CPC ............. *C09D 201/00* (2013.01); *H05K 3/28* (2013.01); *H05K 5/0017* (2013.01); *H05K 5/0047* (2013.01); *H05K 5/0069* (2013.01); *H05K 5/0073* (2013.01); *H05K 7/20481* (2013.01); *H05K 7/20854* (2013.01)

(58) Field of Classification Search
  CPC .... H05K 7/20854; H05K 5/0017; H05K 3/28; C09D 7/40; C09D 201/00; C09D 5/00; B60R 16/02
  See application file for complete search history.

(56) References Cited

U.S. PATENT DOCUMENTS

2013/0112109 A1* 5/2013 Chen .................. C09D 5/00
                                                  106/287.18
2015/0194713 A1* 7/2015 Jin .................. H01M 10/6553
                                                  429/120

FOREIGN PATENT DOCUMENTS

| JP | 2013-4611 A | 1/2013 | |
|----|----|----|----|
| JP | 2013-144746 A | 7/2013 | |
| JP | 2014-160718 A | 9/2014 | |
| WO | WO-2013155700 A1 * | 10/2013 | ........ H01M 10/6553 |

OTHER PUBLICATIONS

Japanese-language Written Opinion (PCT/ISA/210) issued in PCT Application No. PCT/JP2015/073450 dated Nov. 2, 2015 (Four (4) pages).

* cited by examiner

IN-VEHICLE CONTROLLER

TECHNICAL FIELD

The present invention relates to an in-vehicle controller, and particularly to a radiation structure using a heat radiation coating film.

BACKGROUND ART

Conventionally, an in-vehicle controller (electronic module) mounted on an automobile is typically configured by a circuit board on which an electronic component containing a heating element such as a semiconductor element is mounted, and a casing in which the circuit board is contained. The casing is typically configured by a base to which the circuit board is fixed and a cover to which the base is assembled to cover the circuit board.

In recent years, such an in-vehicle controller tends to be increased in heating amount along as minimization and multifunctionalization are progressed due to space restriction. For example, PTL 1 discloses a technique of a radiation structure through surface treatment on the casing in order that the heat generated in the electronic component (heating element) is transferred to the casing to be radiated from the outer surface of the casing into the atmosphere.

In addition, PTL 2 discloses a heat radiating method in which a coating film is formed in the surface of a radiating member using a coating material containing ceramics particles.

CITATION LIST

Patent Literature

PTL 1: JP 2004-304200 A
PTL 2: JP 2013-144746 A

SUMMARY OF INVENTION

Technical Problem

In recent years, there is a social request for a miniaturization by densifying an engine room from the viewpoint of saving resources. Even in the in-vehicle controller, the miniaturization is progressed, and accordingly the area of the substrate is minimized and the electronic components are integrated, and thus a heating density is increased. Therefore, there is a request for improving the heat dissipation still more.

As the techniques disclosed in the related art, the heat dissipation may be improved by coating the coating material containing the ceramics particle on the radiating member. However, a still more improvement of the heat dissipation is demanded in order to satisfy the above request.

The invention has been made in view of the above circumstances, and an object thereof is to provide an in-vehicle controller equipped with a heat radiation coating film which can efficiently radiate heat from a high temperature portion such as a heat generating body to a casing.

Solution to Problem

In order to solve the problem, an in-vehicle controller according to the present invention includes a heat radiation coating film, wherein the heat radiation coating film includes a first region that has a first boundary surface abutting on a base material, and a second region that has a second boundary surface where the heat radiation coating film abuts on air, wherein a thermal conductivity of the first region is higher than that of the second region, and wherein a thermal emissivity of the second region is higher than that of the first region.

Advantageous Effects of Invention

According to the invention, it is possible to provide an in-vehicle controller equipped with a heat radiation coating film which can efficiently radiate heat from a high temperature portion such as a heat generating body to a casing.

DESCRIPTION OF EMBODIMENTS

Hereinafter, embodiments of the invention will be described appropriately with reference to the drawings.

Figure 1:
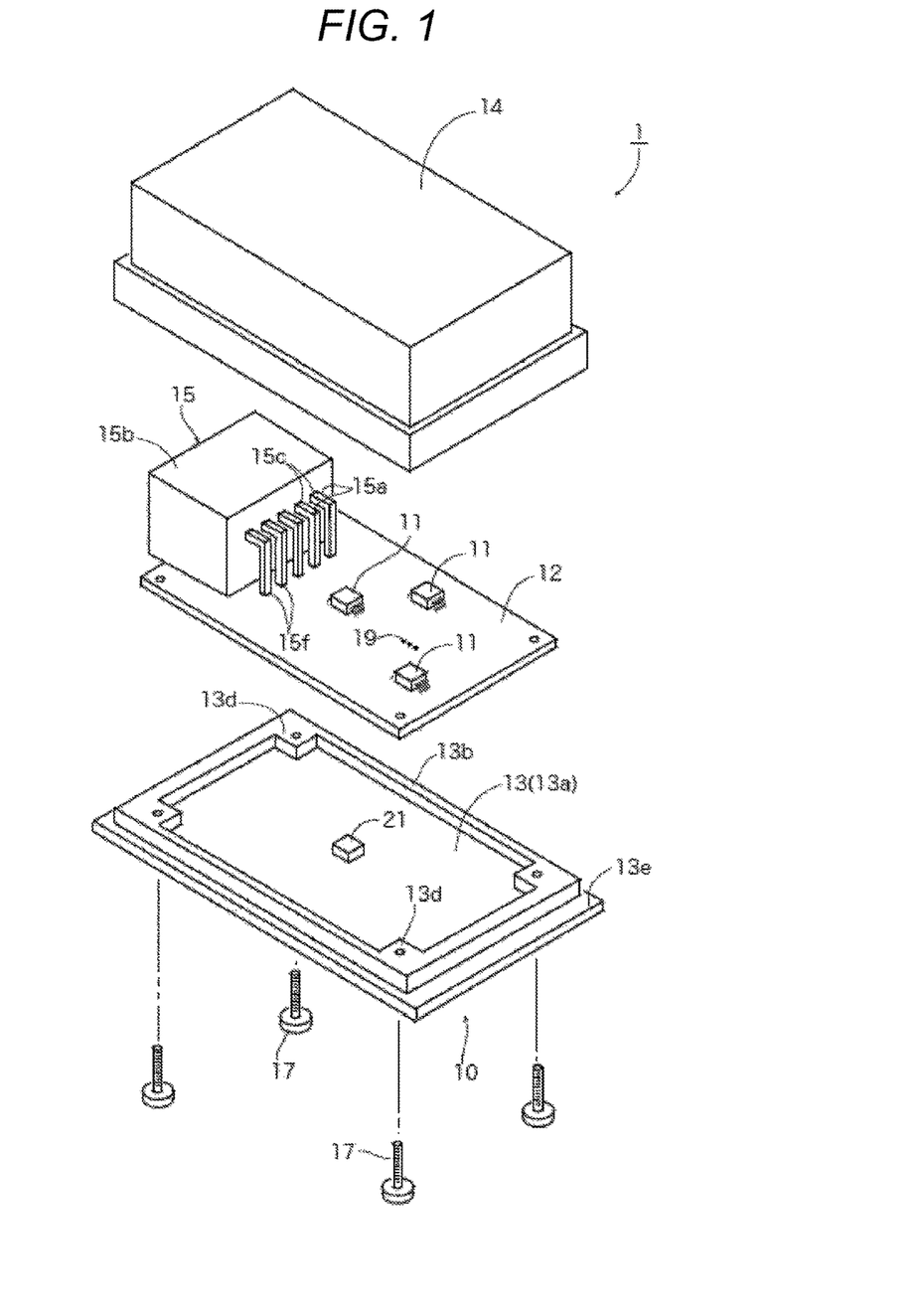
FIG. 1 is an exploded perspective view illustrating an example of a basic configuration of an in-vehicle controller.
Figure 2:
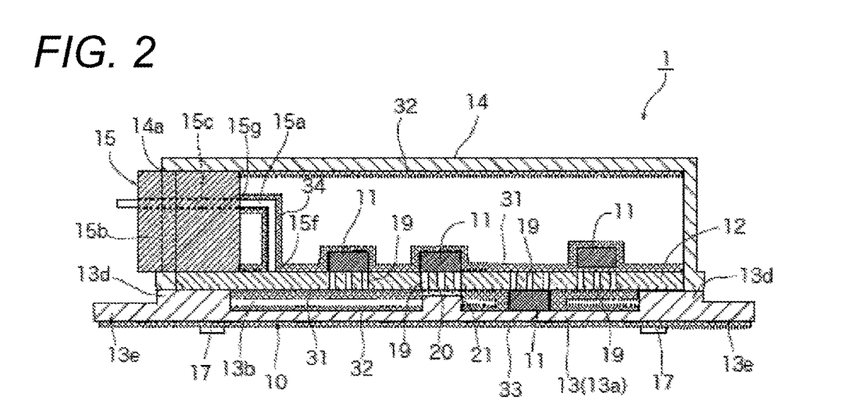
FIG. 2 is a cross-sectional view of the in-vehicle controller.

FIG. 1 is an example of an exploded perspective view illustrating main configurations of an in-vehicle controller. FIG. 2 is a cross-sectional view of the in-vehicle controller in FIG. 1. As illustrated in FIGS. 1 and 2, an in-vehicle controller 1 is configured to include a circuit board 12 where an electronic component 11 such as an IC and a semiconductor element is mounted on both the upper and lower (back and forth) surfaces by welding, and a casing 10 in which the circuit board 12 is contained. The casing 10 includes a base 13 to which a circuit board 12 is fixed, and a cover 14 in a box shape or a lid shape of which the lower surface is opened to assemble the base 13 to cover the circuit board 12.

A connector 15 is adhered to one end side of the circuit board 12 in a longitudinal direction to electrically connect the circuit board 12 to the outside. The connector 15 is provided with a desired number of pin terminals 15a, and a housing 15b equipped with a through hole 15c through which the pin terminal 15a is inserted. In the connector 15, the lower end portion (connection bonding portion 15f) of the pin terminal 15a is connected and bonded to the circuit board 12 by welding through a spot flow process after the pin terminal 15a is inserted into the through hole 15c of the housing 15b.

The base 13 is formed in a substantially rectangular flat shape such that the opening in the lower surface of the cover 14 is completely closed. Specifically, the base 13 is provided with a rectangular flat portion 13a, a rectangular frame portion 13b which is projectingly provided on the rectangular flat portion 13a, a seat portion 13d which is provided in each corner of the rectangular frame portion 13b and becomes a seat of the circuit board 12, and a vehicle assembly fixing portion 13e which is continuously provided on the outer periphery of the rectangular flat portion 13a. The vehicle assembly fixing portion 13e is used to assemble the in-vehicle controller 1 to a vehicle body and, for example, is fixed by screwing a bolt to a predetermined portion of the vehicle body.

The base 13 and the cover 14 forming the casing 10 of the in-vehicle controller 1 are assembled by interposing the circuit board 12 to which the connector 15 is adhered. More specifically, the circuit board 12 is fixed by a setscrew 17 (an example of a fastening member) while being inserted between the seat portions 13d at the four corners of the base 13 and the cover 14.

The base 13 and the cover 14 forming the casing 10 of the in-vehicle controller 1 are assembled by interposing the circuit board 12 to which the connector 15 is adhered. More specifically, the circuit board 12 is fixed by a setscrew 17 (an example of a fastening member) while being inserted between the seat portions 13d at the four corners of the base 13 and the cover 14.

The base 13 and the cover 14 are manufactured by molding, pressing, or cutting using a metal material or a resin material. More specifically, the base and the cover are manufactured by molding, pressing, or cutting using an alloy composed mainly of aluminum, magnesium, and metal, or a resin material such as polybutylene terephthalate.

Further, a connector window 14a is formed in the cover 14 to supply power to the circuit board 12 through the connector 15 from the outside or to transfer input/output signals with respect to an external device.

In the circuit board 12, for example, four electronic components 11 (three on the upper surface side, and one is on the lower surface side) are mounted, and a circuit wiring provided in the circuit board 12 is connected to the electronic component 11, and also to the pin terminal 15a of the connector 15.

In addition, a thermal via (through hole) 19 is provided in a portion where the electronic component 11 in the circuit board 12 is mounted.

The thermal via 19 is provided on a lower surface side of the electronic component 11 placed at the center among three electronic components 11 mounted on the upper surface side of the circuit board 12. A rectangular convex 21 is projectingly provided in a portion just below the thermal via 19 in the base 13. A high heat conductive layer 20 is interposed between the lower surface of the circuit board 12 and the upper surface of the rectangular convex 21 of the base 13 to come into contact with both surfaces. Herein, adhesive, grease, and a heating sheet may be used as the high heat conductive layer 20.

In addition, the electronic component 11 (main portion) placed at the right end among three electronic components 11 mounted on the upper surface side of the circuit board 12 is attached while floating from the upper surface of the circuit board 12, and a gap is formed between the electronic component 11 and the circuit board 12.

In the in-vehicle controller 1 configured as described above, heat generated in the electronic component 11 is transferred to the base 13 through the thermal via 19 and the high heat conductive layer 20, and is radiated from the casing 10 to the atmosphere.

In the in-vehicle controller 1 of this embodiment, heat radiation coating films (31, 32, 33, and 34) are formed in a specific position such as the inside of the circuit board, the cover, the base, and the connector pin.

In this case, after the electronic component 11 and the connector 15 are mounted in the circuit board 12, the heat radiation coating film 31 is formed (coated) in one surface and/or the other surface thereof. After the base 13 and the cover 14 are manufactured in a predetermined dimensional shape, the heat radiation coating films 32 and 33 are formed (coated) in the inner surface and/or the outer surface thereof. In addition, in the pin terminal 15a of the connector 15, the heat radiation coating film 34 is formed (coated) in a portion extending from the connection bonding portion 15f on a side near the circuit board 12 to a connector housing 15b.

As a coating method, a brush coating, a spray coating, and an immersion coating are desirable, and an electrostatic coating, a curtain coating, and an electrodeposition coating may be used depending on a coating target. After the material is coated, natural drying and printing are desirably used in the method of drying and coating. At this time, it is preferable that the heat radiation coating film is coated directly on each base material. For example, if the heat radiation coating film is provided in the circuit board after surface treatment using a vapor proofing material, a distance between the surface of the circuit board and the heat radiation coating film is increased, and thus the movement of heat is decreased and the heat dissipation is lowered.

Further, FIG. 2 illustrates an example in which all of the heat radiation coating films 31, 32, 33, and 34 are formed. It is desirable that the heat radiation coating film be provided in the plurality of surfaces from the viewpoint of improving the heat dissipation. However, the heat radiation coating film may be provided in at least one surface inside the circuit board, the cover, the base, and the connector pin. Particularly, it is desirable that the first heat radiation coating film be formed in at least one surface of the circuit board, and a second heat radiation coating layer be formed on the inner surface side of the base and/or the cover facing the first heat radiation coating film. When at least two heat radiation coating films are formed, a high heat radiation surface is increased, the heat generated from the electronic component containing the heating element and the heat transferring to the circuit board are radiated by one heat radiation coating film, and the other heat radiation coating film formed to face the heat radiation coating film absorbs the heat, so that the movement of heat from the electronic component and the circuit board to the casing can be increased. Therefore, the heat dissipation of the in-vehicle controller can be improved, so that the temperature in the casing of the in-vehicle controller of a box type as including the electronic component (heating element) can be suppressed low, and the reliability of the device can be improved.

Further, the heat radiation coating film may be configured to be coated only on a part (in particular, the heating component and the periphery thereof) but not limited to the entire base material surface. Therefore, a reduction of coating material consumption can be reduced by such a coating.

Figure 3:
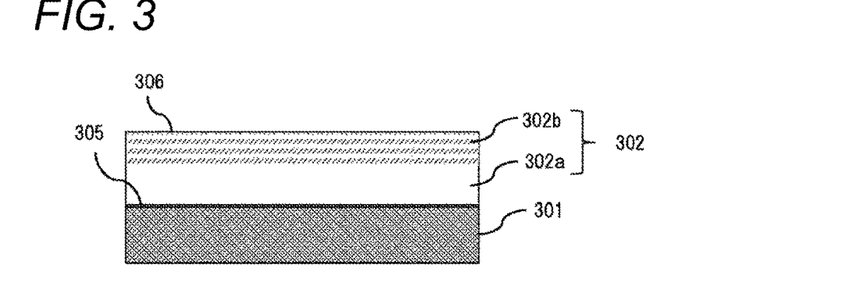
FIG. 3 is a conceptual diagram of a heat radiation coating film of this embodiment.

Next, a specific configuration of the heat radiation coating film of this embodiment will be described. FIG. 3 is a conceptual diagram illustrating a structure of the heat radiation coating film. A heat radiation coating film 302 is formed in the surface of a base material 301 such as the circuit board, the cover, the base, and the connector pin. The heat radiation coating film 302 includes a first region 302a which has a first boundary surface 305 abutting on the base material 301, and a second region 302b which has a second boundary surface 306 where the heat radiation coating film abuts on the air. In the heat radiation coating film of this embodiment, a thermal conductivity of the first region 302a is higher than that of the second region 302b, and a thermal emissivity of the second region 302b is higher than that of the first region 302a. With such a configuration of the heat radiation coating film, the heat of the base material 301 can be transferred to the surface of the heat radiation coating film through the first region having an excellent thermal conductivity. Then, the heat can be effectively radiated from the surface of the heat radiation coating film to the atmosphere using the second region having an excellent heat radiation. In this way, the heat radiation coating film of this embodiment can radiate heat from a high temperature portion such as a heat generating body to the casing more effectively than the related art by separating the function into a region serving for the heat conductivity in a moving direction of heat and a region serving for the heat radiation.

A material for forming the heat radiation coating film is not particularly limited as long as the material is heat-radiated, and an organic resin or a composite composed of particles having an excellent thermal conductivity or thermal emissivity compared to the organic resin are most desirable. As illustrated in FIG. 3, as a method of forming the heat radiation coating film having different characteristics in the first region 302a and the second region 302b, a method of integrally coating and forming a film using a one-liquid type of heat radiation material which contains particles mainly contributing to the heat radiation and particles mainly contributing to the thermal conductivity besides a method of coating the heat radiation material forming the second region 302b to form a film after a heat radiation material forming the first region 302a is coated on the base material.

Hereinafter, specific examples of a two-layer coating type of heat radiation material and a one-liquid type of heat radiation material will be described.

(Two-Layer Coating Type)

The two-layer coating type of heat radiation material forming the heat radiation coating film is configured by two types such as a high heat conductive material forming a first layer which abuts on the base material and a high heat radiation material forming a second layer which is coated on the first layer.

The high heat conductive material forming the first layer (first region) contains particles which have a thermosetting resin or a thermoplastic resin as a binder and have a thermal conductivity higher than that of a binder resin. The conventional well-known particles having a high thermal conductivity can be used and, ceramic powders such as boron nitride, aluminum nitride, aluminum oxide, magnesium oxide, titanium oxide, zirconia, iron oxide, copper oxide, nickel oxide, cobalt oxide, lithium oxide, titanium oxide, and silica oxide, metal powders such as copper, nickel, iron, and silver, and a carbon material may be exemplified, and a combination of at least one of these materials is suitable, but not particularly limited thereto. In a case where an insulating property is necessary for a coating target such as the circuit board where the electronic component of the in-vehicle controller is mounted, the heat radiation coating film is required to have the insulation property. Therefore, the heat radiation material forming the heat radiation coating film is suitable to be mixed with a material having the insulation property such as the ceramic powders. An average particle diameter of the particles having a high thermal conductivity is 0.01 to 200 μm, but not particularly limited thereto. When the average particle diameter of the particles having a high thermal conductivity exceeds 200 μm, a film thickness of a coating film becomes thick and causes the heat radiation to be lowered. Therefore, there is a concern in that strength of the coating film, and adhesive strength and close adherence with respect to the coating film is lowered. In addition, when the average particle diameter is less than 0.01 μm, there is a concern in that the boundary surface between the particles and the binder is increased, and the thermal conductivity is lowered. The conventional particle shape having a high heat conductivity may be used, and a circular shape, a flack shape, a needle-like shape, a cuboid shape, a cube, a tetrahedron, a hexahedron, a polyhedron, a cylindrical shape, a tube shape, and a three-dimensional needle-like structure which extends in different four axis directions from a nuclear part may be exemplified, but not particularly limited thereto. In addition, in a case where the thermal conductivity of the resin forming the first layer is higher than that of the second layer, the high heat conductive material forming the first layer may be a resin which does not contain particles.

The high heat radiation material forming the second layer (second region) contains particles having a thermal emissivity higher than that of the first layer. The high heat radiation material may contain the thermosetting resin or the thermoplastic resin as the binder. The conventional well-known particles having a high thermal emissivity can be used and, ceramic powders such as boron nitride, aluminum nitride, aluminum oxide, magnesium oxide, titanium oxide, zirconia, iron oxide, copper oxide, nickel oxide, cobalt oxide, lithium oxide, titanium oxide, and silica oxide, and a carbon material may be exemplified, and a combination of at least one of these materials is suitable, but not particularly limited thereto. In a case where two or more types of particles having a high thermal emissivity are mixed, these particles are desirably combined not to be overlapped by an absorbance of 0.5 or more in an infrared absorption region of 1200 to 500 $cm^{-1}$. Electromagnetic waves can be radiated in a wide wavelength region, and a heat radiating performance is improved. The average particle diameter of particles having a high thermal emissivity is suitably 0.1 to 300 μm, but not particularly limited thereto. When the average particle diameter exceeds 300 μm, there is a concern in that the particles fall away from the heat radiation coating film, and the heat radiating performance is lowered. In addition, when the average particle diameter is less than 0.1 μm, there is a concern in that the particles are covered by the binder resin, and the heat radiating performance is lowered. The conventional particle shape having a high heat emissivity may be used, and a circular shape, a flack shape, a needle-like shape, a cuboid shape, a cube, a tetrahedron, a hexahedron, a polyhedron, a cylindrical shape, a tube shape, and a shape which extends in different four axis directions from a nuclear part may be exemplified, but not particularly limited thereto.

The high heat radiation material forming the second layer may do not contain a resin and coat only the particles having a high thermal emissivity. In addition, a material obtained by mixing the particles having a high thermal emissivity into a solvent may be used for coating. Alternatively, a material obtained by mixing the particles having a high thermal emissivity into a material obtained by diluting the binder resin with a solvent may be used for coating. When such a material described above is used for coating, the particles on the first layer are exposed from the surface of the coating film after curing, and the heat dissipation is improved due to an increase in the surface area and an increase in the thermal emissivity.

The conventional resin may be used as the thermosetting resin or the thermoplastic resin, and a synthetic resin and an aqueous emulsion resin may be exemplified, but not particularly limited thereto. As the synthetic resin, there is a synthetic resin such as a phenol resin, an alkyd resin, a melamine urea resin, an epoxy resin, a polyurethane resin, a polyvinyl acetate resin, an acrylic resin, a chlorinated rubber resin, a vinyl chloride resin, and a fluorocarbon resin, and desirably there is a cheap acrylic resin. In addition, as the aqueous emulsion, there are a silicon acrylic emulsion, a urethane emulsion, and an acrylic emulsion. In the two-layer coating type of heat radiation material, the resin of the high heat conductive material forming the first layer does not need to be equal to the resin of the high heat radiation material forming the second layer; however, if so, the adhesive strength and the close adherence between the layers are improved.

The two-layer coating type of heat radiation material is desirably coated with the high heat radiation material forming the second layer before the high heat conductive material forming the first layer is cured. When the material forming the second layer is coated after the material forming the first layer is cured, there is a concern in that the adhesive strength and the close adherence between the first layer and the second layer are lowered.

In addition, the two-layer coating type of heat radiation material may be disposed in an intermediate layer where the material forming the first layer and the material forming the second layer are mixed. With the intermediate layer, the adhesive strength and the close adherence are improved, and the thermal conductivity is also improved.

The heat radiation material may be added with a component other than the above components as needed. Examples of the component include a solvent, a film-forming agent, a plasticizing agent, a pigment, a silane coupling agent, and a viscosity modifier. As the component, the conventional one may be used, and the invention is not particularly limited thereto.

(One-Liquid Type)

The one-liquid type of heat radiation material forming the heat radiation coating film of this embodiment uses the thermosetting resin or the thermoplastic resin as the binder, and contains two or more types of particles such as the particles having a thermal conductivity higher than that of the binder resin and the particles having a thermal emissivity higher than that of the binder resin.

As the one-liquid type of heat radiation material, there is a need to disperse the particles having a high thermal conductivity mainly into the first region and the particles having a high thermal emissivity mainly into the second region after coating and forming a film. With this regard, in this embodiment, the particles having a high thermal emissivity is dispersed mainly into the second region using the fact that the particles having a high thermal emissivity are set to be a density smaller than that of a resin component (binder) and thus the particles having a less density float up to the coating surface.

The density of the particles having a high thermal conductivity is larger than that of the particles having a high thermal emissivity, and desirably equal or larger than that of the resin component (binder). As the particles having a high thermal conductivity, the materials described in the two-layer coating type may be used as long as the above conditions are satisfied.

The particles having a high thermal emissivity may have a thermal emissivity higher than that of the resin component (binder) and have a density lesser than that of the resin component (binder). Powders of an inorganic system such as silica oxide and aluminum oxide, or an organic system such as a phenol resin, an epoxy resin, a urea resin, and carbon may be exemplified as a material, and a material obtained by mixing at least one of them is suitable, but are not particularly limited thereto. In a case where two or more types of particles are mixed, these particles are desirably combined not to be overlapped by an absorbance of 0.5 or more in an infrared absorption region of 1200 to 500 $cm^{-1}$. Electromagnetic waves can be radiated in a wide wavelength region, and a heat radiating performance is improved. The average particle diameter of particles having a high emissivity is suitably 0.1 to 300 µm, but not particularly limited thereto. When the average particle diameter exceeds 300 µm, there is a concern in that the particles fall away from the heat radiation coating film, and the heat radiating performance is lowered. In addition, when the average particle diameter is less than 0.1 µm, there is a concern in that the particles are covered by the binder resin, and the heat radiating performance is lowered. The conventional particle shape having a high heat emissivity may be used, and a circular shape, a flack shape, a needle-like shape, a cuboid shape, a cube, a tetrahedron, a hexahedron, a polyhedron, a cylindrical shape, a tube shape, and a shape which extends in different four axis directions from a nuclear part may be exemplified, but not particularly limited thereto. In particular, hollow particles or porous particles are desirably used to make a less density. In addition, the particles coated with resin powders may be used.

The conventional resin may be used as the thermosetting resin or the thermoplastic resin, and a synthetic resin and an aqueous emulsion resin may be exemplified, but not particularly limited thereto. As the synthetic resin, there is a synthetic resin such as a phenol resin, an alkyd resin, an amino alkyd resin, a urea resin, a silicon resin, a melamine urea resin, an epoxy resin, a polyurethane resin, a polyvinyl acetate resin, an acrylic resin, a chlorinated rubber resin, a vinyl chloride resin, and a fluorocarbon resin, and desirably there is a cheap acrylic resin. In addition, as the aqueous emulsion, there are a silicon acrylic emulsion, a urethane emulsion, and an acrylic emulsion.

The heat radiation coating film formed by the one-liquid type of heat radiation material may be disposed in an intermediate region between the first region having a first boundary surface abutting on the base material and the second region having the second boundary surface where the heat radiation coating film abuts on the air. The intermediate region is a region where the particles having a high thermal conductivity and the particles having a high emissivity are mixed.

The heat radiation material may be added with a component other than the above components as needed. Examples of the component include a solvent, a film-forming agent, a plasticizing agent, a pigment, a silane coupling agent, and a viscosity modifier. As the component, the conventional one may be used, and the invention is not particularly limited thereto.

The coating method of the heat radiation material is not particularly limited to both the two-layer coating type and the one-liquid type, and the method may be selected according to the purpose from among the generally used coating methods. Specifically, the brush coating, the spray coating, the coating using a roll coater, and the immersion coating may be exemplified. After the heat radiation material is coated, the natural drying and the printing may be used in the method of drying and coating, and is selected according to coating material properties.

In addition, an average film thickness of the heat radiation coating film is not particularly limited, and may be selected according to the purpose (desirably 200 μm or less, and more desirably 1 μm to 200 μm). In a case where the average film thickness of the coating film is 200 μm or more, there is a concern in that the coating film serves as a heat insulating layer, and thus the heat dissipation is lowered. In addition, in a case where the average film thickness of the coating film is 1 μm or less, there is a concern in that a radiation effect is not sufficient. More desirably, the film thickness of the heat radiation coating film is 20 μm to 40 μm. If the film thickness is thicker than 40 μm, the absorbed heat is blocked; if thinner than 20 μm, the heat radiating performance is lowered. Therefore, the movement of heat from a high temperature portion such as a heat generating body to the outside of the casing is reduced.

In addition, in the heat radiation coating film, the thermal emissivity with respect to each wavelength in wavelength region of 2.5 μm to 20 μm is desirably 0.8 or more, and more desirably as approaching to 1 as possible from the viewpoint of the heat radiation.

Hereinafter, the description will be given in detail using embodiments. However, the invention is not limited to the content described in the following embodiments.

The component materials of the heat radiation material used in the embodiments and comparative examples are as follows.

(Binder Resin)

Coatax LH-404: made by Toray Fine Chemicals (Ceramics Particles)

S42XHS: made by Sumitomo 3M, hollow silica, true density of 0.42 g/cm$^3$

SI007PB: made by Kojundo chemical laboratory Co., Ltd., silica oxide, particle diameter of 0.8 μm WZ-501: made by Amtec, zinc oxide single crystal pana-tetra, average fiber length of 10 μm Samples were mixed using a hybrid mixer after the viscosity was adjusted by adding particles, resin, and solvent.

An evaluation method of the thermal conductivity, the thermal emissivity, and the radiation in the embodiments is as follows.

(Thermal Conductivity)

In a method of measuring the thermal conductivity, the adjusted material was formed to be a film of 200 μm, a thermal diffusion factor was obtained using a temperature frequency analysis, and a product of the thermal diffusion factor, a specific weight, and a specific heat was obtained.

Further, in a case where a material of the heat radiation coating film is not clear, the binder resin is specified using an analysis method such as an IR (infrared spectroscopy) or a GCMS (gaschromatography), the particles are specified by performing an elementary analysis such as a SEM-EDX (scanning electron microscope-energy dispersion type of X-ray analysis) on the cross section of the heat radiation coating film, and the thermal conductivity of the heat radiation coating film can be measured by the same method as described above.

(Thermal Emissivity)

As an emissivity measuring method, an emissivity of a cured sample is measured at room temperature using D and S AERD made by Kyoto electronics manufacturing Co., Ltd. after the adjusted material is coated by about 30 μm on an aluminum plate having a size 100 mm×100 mm and a thickness of 1 mm.

Further, in a case where a material of the heat radiation coating film is not clear, the heat radiation can be clear such that the binder resin is specified using an analysis method such as an IR (infrared spectroscopy) or a GCMS (gaschromatography), the particles are specified by performing an elementary analysis such as a SEM-EDX (scanning electron microscope-energy dispersion type of X-ray analysis) on the cross section of the heat radiation coating film, and the thermal conductivity of the heat radiation coating film can be measured by the same method as described above.

(Evaluation on Radiation)

A planar heat generating body polyimide heater FL-HEAT No. 6 (Shinwa measuring tools Corp.) is interposed using aluminum plates (50 mm=80 mm, t: 2 mm). Thermoelectric couple is bonded to the surface of the aluminum plates using solder for aluminum plates. A mixed sample was coated on the surface of the aluminum plate, heated at 60° C., and dried for 30 minutes so as to be coated by a film thickness of 30 μm. The sample was placed in the center of a constant temperature oven at 25° C., 6 W was applied to the heater, and then a temperature variation in the surface of the aluminum plate was measured. Since the heater generates a constant amount of heat, the temperature of the heater or the surface temperature of the aluminum plate is lowered as the radiation effect of the heat radiation material is increased. In other words, it can be said that the radiation effect is increased as the temperature of the heater or the surface temperature of the aluminum plate is lowered.

First Embodiment

Coatax LH-404: 90 vol %, hollow silica: 5 vol %, silica oxide: 5 vol %, and butyl acetate solvent: 30 wt % with respect to a total 100 wt % of these three components were put in a container and mixed using the hybrid mixer to create the one-liquid type of heat radiation material. The heat radiation material was coated on the aluminum plate by the brush coating, heated at 60° C., and dried for 30 minutes so as to form the heat radiation coating film such that the film thickness became 30 μm.

Figure 4:
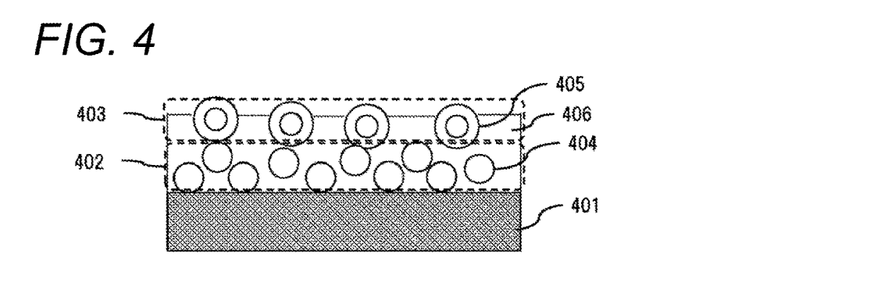
FIG. 4 is a schematic cross-sectional view of the heat radiation coating film of a first embodiment.

FIG. 4 illustrates a schematic cross-sectional view of the heat radiation coating film formed in the first embodiment. The heat radiation coating film formed on the surface of an aluminum plate 401 is provided with a configuration in which a hollow silica 405 and a silica oxide 404 are dispersed into a resin (Coatax LH-404) 406. In the drawing, the silica oxide 404 having a high thermal conductivity is dispersed mainly into a first region 402 depicted by a dotted frame, and the hollow silica 405 having a high heat radiation is dispersed mainly into a second region 403. This is because the density of the hollow silica 405 is smaller than that of a resin 406 and thus the hollow silica 405 floats up to the coating surface when coating the heat radiation material. In addition, for such a characteristic, a heat radiation surface of the heat radiation coating film has irregularities caused by the shape of the hollow silica 405.

Second Embodiment

Coatax LH-404: 90 vol %, hollow silica: 5 vol %, zinc oxide single crystal pana-tetra: 5 vol %, and butyl acetate solvent: 30 wt % with respect to a total 100 wt % of these three components were put in a container and mixed using the hybrid mixer to create the one-liquid type of heat radiation material. The heat radiation material was coated on the aluminum plate by the brush coating, heated at 60° C., and dried for 30 minutes so as to form the heat radiation coating film such that the film thickness became 30 μm.

Figure 5:
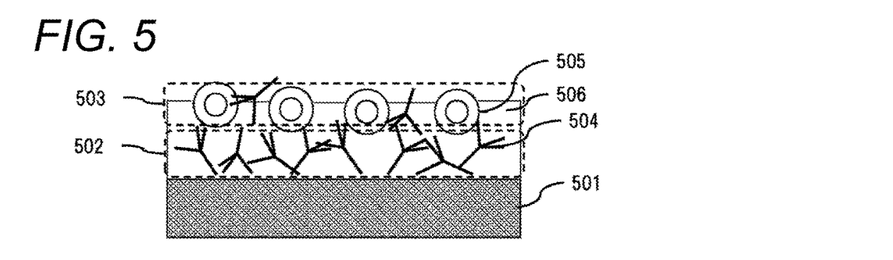
FIG. 5 is a schematic cross-sectional view of the heat radiation coating film of a second embodiment.

FIG. 5 illustrates a schematic cross-sectional view of the heat radiation coating film formed in the second embodiment. The heat radiation coating film formed on the surface of an aluminum plate 501 is provided with a configuration in which a hollow silica 505 and a zinc oxide single crystal pana-tetra 504 are dispersed into a resin (Coatax LH-404) 506. In the drawing, the zinc oxide single crystal pana-tetra 504 having a high thermal conductivity is dispersed mainly into a first region 502 depicted by a dotted frame, and the hollow silica 505 having a high heat radiation is dispersed mainly into a second region 503. The reason why the hollow silica 505 is concentrated in the second region 503 is the same as that of the first embodiment. In addition, the zinc oxide single crystal pana-tetra 504 used in this embodiment is formed in a three-dimensional shape which extends in different four axis directions from the nuclear part. With such a bulky shape, the zinc oxide single crystal pana-tetras 504 are dispersed while being interwound. In addition, some zinc oxide single crystal pana-tetras 504 are interwound with the hollow silica and disposed even in the second region. The heat radiation surface of the heat radiation coating film of this embodiment has irregularities caused by the shapes of the hollow silica 505 and the zinc oxide single crystal pana-tetra 504.

Third Embodiment

Coatax LH-404: 95 vol %, zinc oxide single crystal pana-tetra: 5 vol %, butyl acetate solvent: 30 wt % with respect to a total 100 wt % of these two components were put in a container and mixed using the hybrid mixer to create a first heat radiation material. In addition, Coatax LH-404: 95 vol %, hollow silica: 5 vol %, and butyl acetate solvent: 30 wt % with respect to a total 100 wt % of these two components were put in a container and mixed using the hybrid mixer to create a second heat radiation material.

The first heat radiation material was coated on the aluminum plate by the brush coating to create the first layer. Next, the second heat radiation material was coated from about the first layer by the brush coating to create the second layer, heated at 60° C., and dried for 30 minutes so as to form the heat radiation coating film such that the film thickness becomes 30 μm.

Figure 6:
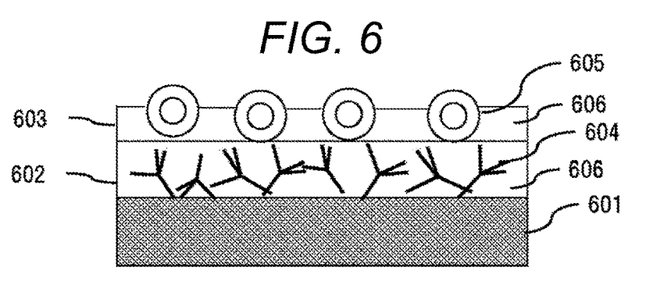
FIG. 6 is a schematic cross-sectional view of the heat radiation coating film of third and fourth embodiments.

FIG. 6 illustrates a schematic cross-sectional view of the heat radiation coating film formed in the third embodiment. The heat radiation coating film formed on the surface of an aluminum plate 601 is configured by a first layer (first region) 602 in which the zinc oxide single crystal pana-tetra 504 is dispersed into a resin (Coatax LH-404) 606, and a second layer (second region) 603 in which a hollow silica 605 is dispersed into the resin 606. In the second layer, the hollow silica 605 floats up to the coating surface, so that the heat radiation surface of the heat radiation coating film has irregularities caused by the shape of the hollow silica 605.

Fourth Embodiment

Coatax LH-404: 95 vol %, zinc oxide single crystal pana-tetra: 5 vol %, butyl acetate solvent: 30 wt % with respect to a total 100 wt % of these two components were put in a container and mixed using the hybrid mixer to create a first heat radiation material. In addition, Coatax LH-404: 70 vol %, hollow silica: 30 vol %, and butyl acetate solvent: 30 wt % with respect to a total 100 wt % of these two components were put in a container and mixed using the hybrid mixer to create a second heat radiation material.

The first heat radiation material was coated on the aluminum plate by the brush coating to create the first layer. Next, the second heat radiation material was coated from about the first layer by the brush coating to create the second layer, heated at 60° C., and dried for 30 minutes so as to form the heat radiation coating film such that the film thickness becomes 30 μm.

A basic configuration of the heat radiation coating film formed in the fourth embodiment is the same as that of FIG. 6. The amount of the hollow silica contained in the second layer was increased as much as the mixing amount of the hollow silica in the second heat radiation material was increased, and the surface area of the heat radiation surface of the heat radiation coating film was increased compared to that of the fourth embodiment.

Fifth Embodiment

Coatax LH-404: 95 vol %, zinc oxide single crystal pana-tetra: 5 vol %, butyl acetate solvent: 30 wt % with respect to a total 100 wt % of these two components were put in a container and mixed using the hybrid mixer to create a first heat radiation material.

The first heat radiation material was coated on the aluminum plate by the brush coating, and the hollow silica was coated as the second heat radiation material from above the coating film, heated at 60° C., and dried for 30 minutes so as to create the heat radiation coating film such that the film thickness became 30 μm.

Figure 7:
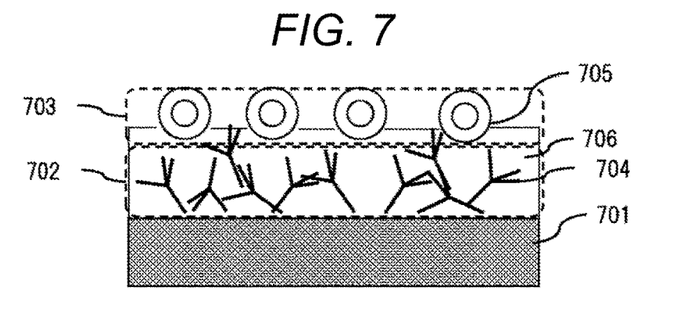
FIG. 7 is a schematic cross-sectional view of the heat radiation coating film of a fifth embodiment.

FIG. 7 illustrates a schematic cross-sectional view of the heat radiation coating film formed in the fifth embodiment. The heat radiation coating film formed on the surface of an aluminum plate 701 is configured such that a zinc oxide single crystal pana-tetra 704 is dispersed into a resin (Coatax LH-404) 706, and a portion of a hollow silica 705 is buried in the surface layer portion of the resin 706. In the drawing, the zinc oxide single crystal pana-tetra 704 having a high thermal conductivity is dispersed into a first region 702 depicted by a dotted frame, and the hollow silica 705 having a high thermal emissivity is dispersed mainly into a second region 703. The heat radiation surface of the heat radiation coating film has irregularities caused by the shape of the hollow silica 705.

Sixth Embodiment

In addition, Coatax LH-404: 95 vol %, hollow silica: 5 vol %, and butyl acetate solvent: 30 wt % with respect to a total 100 wt % of these two components were put in a container and mixed using the hybrid mixer to create the one-liquid type of heat radiation material. The heat radiation material was coated on the aluminum plate by the brush coating, heated at 60° C., and dried for 30 minutes so as to form the heat radiation coating film such that the film thickness became 30 μm.

Figure 8:
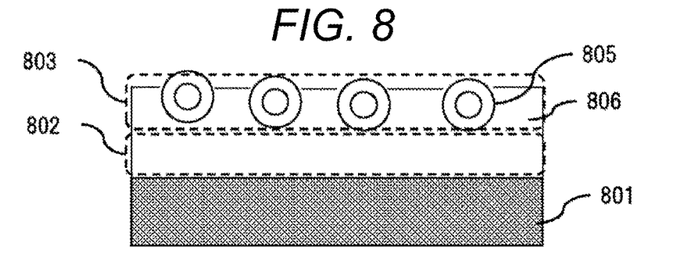
FIG. 8 is a schematic cross-sectional view of the heat radiation coating film of a sixth embodiment.

FIG. 8 illustrates a schematic cross-sectional view of the heat radiation coating film formed in the sixth embodiment. The heat radiation coating film formed in the surface of an aluminum plate 801 is provided with a configuration in which a hollow silica 805 is dispersed into a resin (Coatax LH-404) 806. In the drawing, only the resin 806 is configured in a first region 802 depicted by a dotted frame without the hollow silica 805, and the hollow silica 805 having a high thermal emissivity is dispersed mainly into a second region 803. In this way, the hollow silica 805 is disposed in the second region 803 much more than in the first region 802. This is because the density of the hollow silica 405 is smaller than that of a resin 406 and thus the hollow silica 405 floats up to the coating surface when coating the heat radiation material. The heat radiation surface of the heat radiation coating film has irregularities caused by the shape of the hollow silica 405.

Seventh Embodiment

The 30 wt % butyl acetate solvent was mixed, Coatax LH-404 adjusted in the viscosity was coated on the aluminum plate by the brush coating, the hollow silica was coated over the resin film, heated at 60° C., and dried for 30 minutes so as to create the heat radiation coating film such that the film thickness became 30 μm.

Figure 9:
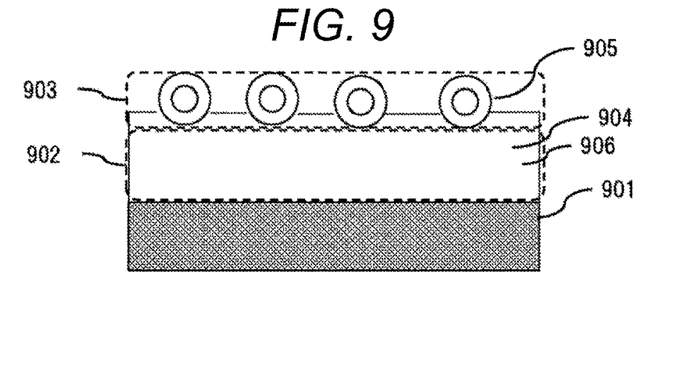
FIG. 9 is a schematic cross-sectional view of the heat radiation coating film of a seventh embodiment.

FIG. 9 illustrates a schematic cross-sectional view of the heat radiation coating film formed in the seventh embodiment. The heat radiation coating film formed in the surface of an aluminum plate 901 is configured such that only a resin (Coatax LH-404) 906 is disposed in a first region 902 depicted by a dotted frame in the drawing without a hollow silica 905, and a portion of the hollow silica 905 is buried in the surface layer portion of the resin 906 in a second region 903.

First Comparative Example

The 30 wt % butyl acetate solvent was mixed, and Coatax LH-404 adjusted in the viscosity was coated in the aluminum plate by the brush coating, heated at 60° C., and dried for 30 minutes so as to create a coating film such that the film thickness became 30 μm.

Table 1 shows the results obtained by evaluating the characteristics of the coating film of the first comparative example.

Second Comparative Example

Coatax LH-404: 95 vol %, silica oxide: 5 vol %, and butyl acetate solvent: 30 wt % with respect to a total 100 wt % of these two components were put in the container and mixed using the hybrid mixer to create the one-liquid type of heat radiation material. The heat radiation material was coated on the aluminum plate by the brush coating, heated at 60° C., and dried for 30 minutes so as to form the heat radiation coating film such that the film thickness became 30 μm.

Figure 10:
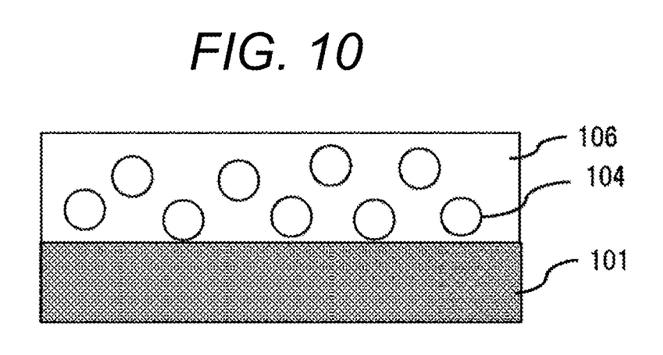
FIG. 10 is a schematic cross-sectional view of the heat radiation coating film of a second comparative example.

FIG. 10 illustrates a schematic cross-sectional view of the heat radiation coating film formed in the second comparative example. The heat radiation coating film formed in the surface of an aluminum plate 101 is provided with a configuration in which a silica oxide 104 is dispersed into a resin (Coatax LH-404) 106. A dispersion state of the silica oxide 104 in the resin 106 had no significant deviation in the first and second regions. In addition, the radiation surface of the heat radiation coating film was flat having no irregularities caused by the particle shape.

The configurations of the heat radiation materials of the first to seventh embodiments and the first and second comparative examples and the results of evaluation on various characteristics of the heat radiation coating film are shown in Tables 1 and 2. Further, units of numerical values in the tables are volume parts, and "-" means non-contained.

TABLE 1

| | | First comparative example | Second comparative example | One-liquid coating type | | | | | |
|---|---|---|---|---|---|---|---|---|---|
| | | | | First embodiment | | Second embodiment | | Sixth embodiment | |
| Particles | S42XH5 | — | — | 5 | | 5 | | 5 | |
| | SIO07PB | — | 5 | 5 | | — | | — | |
| | WZ-501 | — | — | — | | 5 | | — | |
| Resin | | 100 | 95 | 90 | | 90 | | 95 | |
| Highest temperature | | 100 | 90 | 80 | | 75 | | 85 | |
| Emissivity | | 0.50 | 0.75 | Region 1 | Region 2 | Region 1 | Region 2 | Region 1 | Region 2 |
| | | | | 0.75 | 0.85 | 0.80 | 0.85 | 0.50 | 0.85 |
| Heat conductivity | | 0.2 | 0.3 | Region 1 | Region 2 | Region 1 | Region 2 | Region 1 | Region 2 |
| | | | | 0.3 | 0.2 | 1.25 | 0.15 | 0.2 | 0.15 |

TABLE 2

| | | Two-liquid coating type | | | | | | | |
|---|---|---|---|---|---|---|---|---|---|
| | | Third embodiment | | Fourth embodiment | | Fifth embodiment | | Seventh embodiment | |
| First high heat conductive layer | Particles | 5 (WZ-501) | | 5 (WZ-501) | | 5 (WZ-501) | | — | |
| | Resin | 95 | | 95 | | 95 | | 100 | |
| Second high heat conductive layer | Particles | 5 (S42XHS) | | 30 (S42XHS) | | 30 (S42XHS) | | 30 (S42XHS) | |
| | Resin | 95 | | 70 | | — | | — | |
| Highest temperature | | 77 | | 70 | | 65 | | 83 | |
| Emissivity | | Region 1 | Region 2 | Region 1 | Region 2 | Region 1 | Region 2 | Region 1 | Region 2 |
| | | 0.80 | 0.85 | 0.80 | 0.87 | 0.80 | 0.90 | 0.5 | 0.90 |
| Heat conductivity | | Region 1 | Region 2 | Region 1 | Region 2 | Region 1 | Region 2 | Region 1 | Region 2 |
| | | 1.25 | 0.15 | 1.25 | 0.18 | 1.25 | 0.13 | 0.2 | 0.13 |

As shows in Tables 1 and 2, the thermal conductivity of the first region in the first to seventh embodiments is higher than that of the second region, and the thermal emissivity of the second region satisfies a relation that it is higher than the thermal emissivity of the first region. As a result of evaluation on the radiation, it can be seen that the highest temperatures of the first to seventh embodiments are low compared to the first and second comparative examples, and an excellent heat dissipation is obtained. In addition, an excellent heat dissipation is obtained in the second embodiment where the zinc oxide single crystal pana-tetra is used as the particle having a high thermal conductivity compared to the first embodiment where the silica dioxide is used. It is considered that a heat conductive path is formed by interwinding the particles of the three-dimensional shape extending in different four axis directions from the nuclear part, and thus the transferring of heat from the aluminum plate to the radiation surface is promoted, and as a result the heat dissipation is improved. In addition, the second embodiment shows a result that the heat dissipation becomes excellent compared to the third embodiment in which the components and the amounts are the same and the two-liquid coating type is employed. It is considered that a portion of the zinc oxide single crystal pana-tetra is disposed in the surface portion in the one-liquid type of the second embodiment so as to increase the surface area of the heat radiation coating film, and as a result the heat dissipation is improved. Compared to the third to fifth embodiments, the heat dissipation is excellent in the case of the fourth embodiment where the amount of the hollow silica is increased compared to the third embodiment, and the heat dissipation is most excellent in the case of the fifth embodiment where the hollow silica is coated on the first coating layer. It is considered that the surface area of the radiation surface becomes large in an order of the third, fourth, and fifth embodiments, and as a result the heat dissipation is improved. The similar tendency can be found in the comparison between the sixth embodiment and the seventh embodiment.

As described above, when a high heat conductive region (first region) is provided in a region having the boundary surface abutting on the base material of the heat radiation coating film and a high radiation region (second region) is provided in a region having the boundary surface abutting on the air, the movement of heat from a heat generating body is increased, and the heat dissipation is improved. The heat radiation coating film of this embodiment is formed in a high temperature member such as the heat generating body and the casing, and the high heat radiation surface is made to be increased, so that the movement amount of heat to a low temperature portion can be increased, and the heat dissipation of the in-vehicle controller can be improved.

REFERENCE SIGNS LIST 1 in-vehicle controller
10 casing
11 electronic component
12 circuit board
13 base
14 cover
15 connector
15a the pin terminal
15b housing
15c through hole
19 thermal via
20 high heat conductive layer
31 first heat radiation coating layer
32 second heat radiation coating layer
33 third heat radiation coating layer
34 fourth heat radiation coating layer

The invention claimed is:

1. An in-vehicle controller, comprising:
a heat radiation coating film,
wherein the heat radiation coating film includes
a first region that has a first boundary surface abutting on a base material, and
a second region that has a second boundary surface where the heat radiation coating film abuts on air,
wherein a thermal conductivity of the first region is higher than that of the second region,
wherein a thermal emissivity of the second region is higher than that of the first region,
wherein the heat radiation coating film includes an organic resin, particles having a thermal emissivity higher than that of the organic resin, and particles having a thermal conductivity higher than that of the organic resin,
wherein the particles having the higher thermal conductivity are dispersed mainly into the first region, and the particles having the higher thermal emissivity are dispersed into the second region,
wherein a density of the particles of the high thermal emissivity is smaller than that of the organic resin, and
wherein the density of the particles having a high thermal conductivity is larger than the density of the particles having a high thermal emissivity and the density of the particles having a high thermal conductivity is equal or larger than the density of the resin component.

2. The in-vehicle controller according to claim 1,
wherein the heat radiation coating film includes an organic resin, and particles having a thermal emissivity higher than that of the organic resin, and
wherein the particles having the high thermal emissivity are disposed in the second region much more than in the first region.

3. The in-vehicle controller according to claim 2,
wherein a heat radiation surface of the heat radiation coating film has irregularities caused by a shape of the particles.

4. The in-vehicle controller according to claim 1,
wherein a heat radiation surface of the heat radiation coating film has irregularities caused by a shape of the particles of the high thermal emission.

5. The in-vehicle controller according to claim 1,
wherein the particles having the high thermal emissivity are formed as a hollow or a porous shape.

6. The in-vehicle controller according to claim 1, further comprising:
a circuit board in which an electronic component is mounted;
a base to which the circuit board is fixed; and
a cover that is assembled to the base to cover the circuit board,
wherein the heat radiation coating film includes a first heat radiation coating film that is formed in at least one surface of the circuit board, and a second heat radiation coating film that is formed on an inner surface side of the base and/or the cover facing the first heat radiation coating film.

* * * * *